(12) United States Patent
Latto et al.

(10) Patent No.: US 10,375,844 B2
(45) Date of Patent: *Aug. 6, 2019

(54) USER INTERCHANGEABLE ORNAMENTAL PORTIONS OF ELECTRONIC DEVICES

(71) Applicant: INTEL CORPORATION, Santa Clara, CA (US)

(72) Inventors: Antonio T. Latto, Portland, OR (US); Isaac A. Simpson, Milwaukie, OR (US); Markus Diebel, San Francisco, CA (US); Paul Bradley, Woodside, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/622,923

(22) Filed: Jun. 14, 2017

(65) Prior Publication Data

US 2017/0285447 A1 Oct. 5, 2017

Related U.S. Application Data

(63) Continuation of application No. 14/145,772, filed on Dec. 31, 2013, which is a continuation of application
(Continued)

(51) Int. Cl.
*H04M 1/02* (2006.01)
*H05K 5/03* (2006.01)
(Continued)

(52) U.S. Cl.
CPC ......... *H05K 5/0243* (2013.01); *G03B 17/568* (2013.01); *H04M 1/0283* (2013.01);
(Continued)

(58) Field of Classification Search
CPC .......................... H04B 1/3888; H04M 1/0283
(Continued)

(56) References Cited

U.S. PATENT DOCUMENTS

| 4,292,481 A | 9/1981 | Barnes et al. |
| D309,901 S | 8/1990 | Caesar |

(Continued)

FOREIGN PATENT DOCUMENTS

| CN | 1717916 A | 1/2006 |
| DE | 20101039 U1 | 5/2001 |

(Continued)

OTHER PUBLICATIONS

International Search Report, PCT Patent Application No. PCT/US03/00232, dated Apr. 22, 2003, 3 pages.
(Continued)

*Primary Examiner* — Simon Nguyen
(74) *Attorney, Agent, or Firm* — International IP Law Group, P.L.L.C.

(57) ABSTRACT

A method and apparatus is disclosed for the customization of electronic equipment of which portable audio players, portable disc players, portable digital games and laptop computers are representative. The electronic equipment may be fitted with a substantially transparent faceplate that may cover removable inserts. These inserts may be customizable to provide unique decorative appearances to the electronic equipment upon which they may be fitted. Decorative designs may either be preprinted on the inserts or a user may produce a customized design.

9 Claims, 6 Drawing Sheets

Related U.S. Application Data

No. 14/145,767, filed on Dec. 31, 2013, now abandoned, which is a continuation of application No. 13/957,917, filed on Aug. 2, 2013, now abandoned, which is a continuation of application No. 12/827,934, filed on Jun. 30, 2010, now Pat. No. 8,532,720, which is a continuation of application No. 11/716,087, filed on Mar. 9, 2007, now abandoned, which is a continuation of application No. 10/044,613, filed on Jan. 11, 2002, now Pat. No. 7,206,618.

(51) Int. Cl.
  *H05K 5/02* (2006.01)
  *G03B 17/56* (2006.01)
  *H04M 1/725* (2006.01)

(52) U.S. Cl.
  CPC .......... *H05K 5/03* (2013.01); *H04M 1/72544* (2013.01); *Y10T 29/53* (2015.01)

(58) Field of Classification Search
  USPC ..................................................... 455/575.8
  See application file for complete search history.

(56) References Cited

U.S. PATENT DOCUMENTS

| | | | |
|---|---|---|---|
| 5,113,435 A | 5/1992 | Chen | |
| 5,768,370 A | 6/1998 | Maatta et al. | |
| 5,848,152 A | 12/1998 | Slipy et al. | |
| 5,884,772 A | 3/1999 | Floyd et al. | |
| 5,982,881 A | 11/1999 | Mischenko | |
| D425,075 S | 5/2000 | Perry | |
| 6,246,887 B1* | 6/2001 | Eckhardt ............. | H04M 1/0266 379/433.04 |
| D451,094 S | 11/2001 | Powell | |
| 6,324,592 B1 | 11/2001 | Hindman | |
| 6,487,397 B2* | 11/2002 | Fuhrmann ........... | H04M 1/0283 379/433.11 |
| 6,594,472 B1 | 7/2003 | Curtis et al. | |
| 6,599,613 B1 | 7/2003 | Kasahara et al. | |
| 6,649,817 B2* | 11/2003 | Hartill ...................... | G09F 3/18 84/267 |
| 6,721,545 B2 | 4/2004 | Doi | |
| 6,747,578 B1 | 6/2004 | Lam et al. | |
| 6,876,837 B2 | 4/2005 | Kuroshima et al. | |
| 6,898,283 B2 | 5/2005 | Wycherley et al. | |
| 6,975,888 B2 | 12/2005 | Buesseler et al. | |
| 6,978,123 B2 | 12/2005 | Fuhrmann et al. | |
| 6,980,825 B1 | 12/2005 | Anderson et al. | |
| 7,072,621 B1 | 7/2006 | Engstrom et al. | |
| 7,095,986 B2 | 8/2006 | Mager | |
| 7,203,533 B1* | 4/2007 | Tischer ................. | G06F 1/1626 343/787 |
| 7,206,618 B2 | 4/2007 | Latto et al. | |
| 8,532,720 B2 | 9/2013 | Latto et al. | |
| 2002/0037738 A1 | 3/2002 | Wycherley et al. | |
| 2002/0057289 A1 | 5/2002 | Crawford et al. | |
| 2002/0057915 A1 | 5/2002 | Mann | |
| 2002/0065054 A1 | 5/2002 | Humphreys et al. | |
| 2002/0076512 A1* | 6/2002 | Kreider ............... | H04M 1/0283 428/34.1 |
| 2002/0100387 A1 | 8/2002 | Churchwell | |
| 2002/0106952 A1 | 8/2002 | Hashizume et al. | |
| 2003/0017848 A1 | 1/2003 | Engstrom et al. | |
| 2003/0036362 A1 | 2/2003 | Buesseler et al. | |
| 2003/0068035 A1 | 4/2003 | Pirila et al. | |
| 2003/0105961 A1 | 6/2003 | Zatloukal et al. | |
| 2004/0018861 A1 | 1/2004 | Shapiro et al. | |
| 2004/0053650 A1 | 3/2004 | Roper | |
| 2013/0314862 A1 | 11/2013 | Latto et al. | |
| 2014/0112652 A1 | 4/2014 | Latto et al. | |
| 2014/0118913 A1 | 5/2014 | Latto et al. | |

FOREIGN PATENT DOCUMENTS

| | | |
|---|---|---|
| DE | 20104924 U1 | 9/2001 |
| EP | 1182850 A2 | 8/2001 |
| JP | 3054414 U | 7/1989 |
| JP | 11177661 | 2/1999 |
| JP | 11249592 A | 9/1999 |
| JP | 11352886 | 12/1999 |
| JP | 2001075675 | 3/2001 |
| JP | 20030561213 | 1/2003 |
| JP | 2007182436 | 7/2007 |
| TW | 591899 B | 6/2004 |
| WO | 03061250 A1 | 7/2003 |

OTHER PUBLICATIONS

Cellular Accessories & Cell Phone Supplies: Headsets & More; Save the World Face Plate for Nokia; SunnyCell.com, 2000, 1 page.
Cellular Accessories & Cell Phone Supplies: Headsets & More; Tiger Face Plate for Nokia; SunnyCell.com, 2000. cited by applicant, 1 page.
Cellular Accessories & Cell Phone Supplies: Headsets & More; Soccer Face Plate for Nokia; SunnyCell.com2000, 1 page.
Claims as Amended and submitted to the Japanese Patent Office on Oct. 19, 2010 in Application No. 2007-182436, 9 pages.
Search Report received for European Patent Application No. 12162316. 9, dated Jun. 14, 2012, 2 pages.
Cellular Accessories & Cell Phone Supplies: New Design; SunnyCell. com, 2000, 1 page.

* cited by examiner

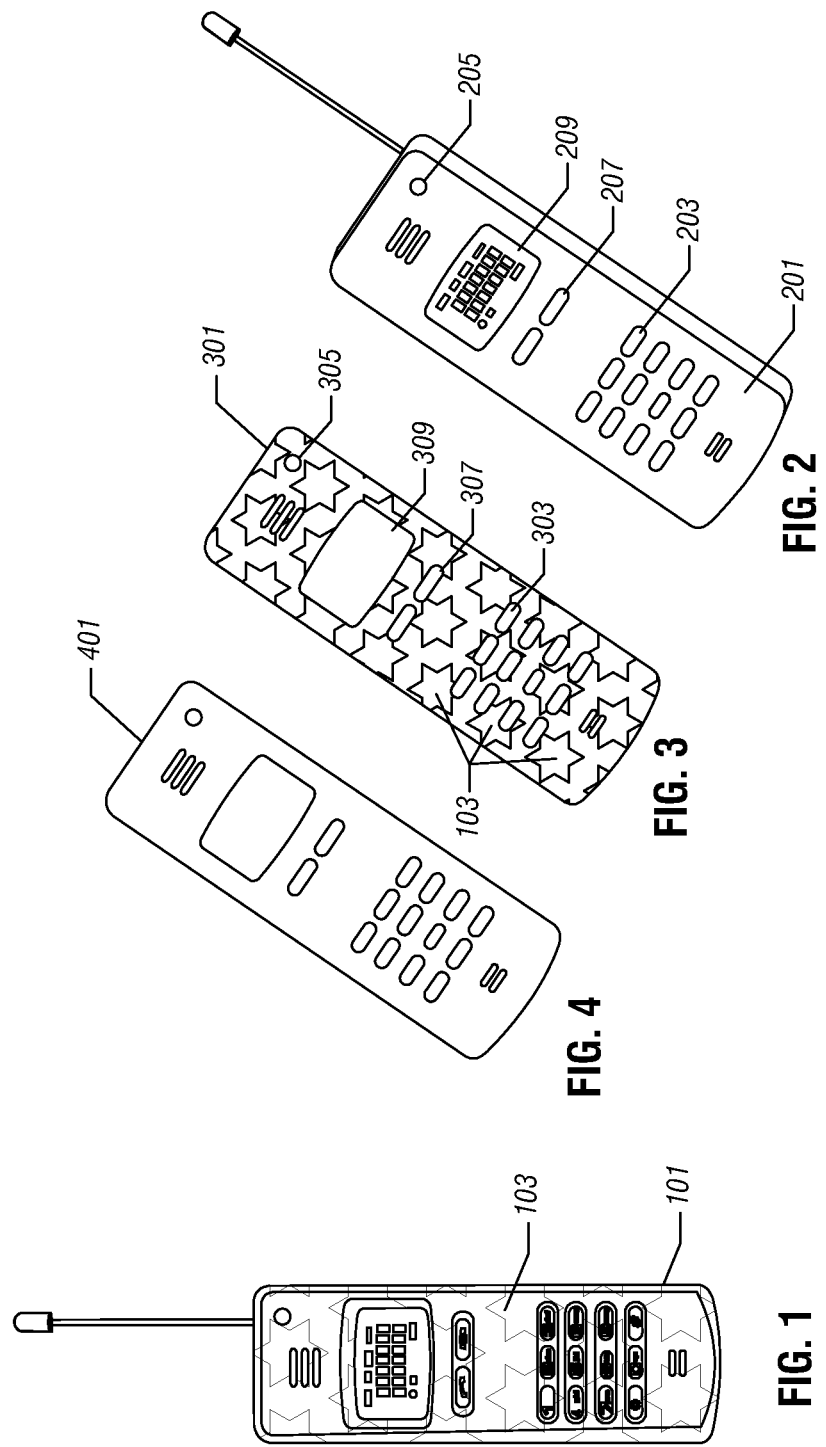

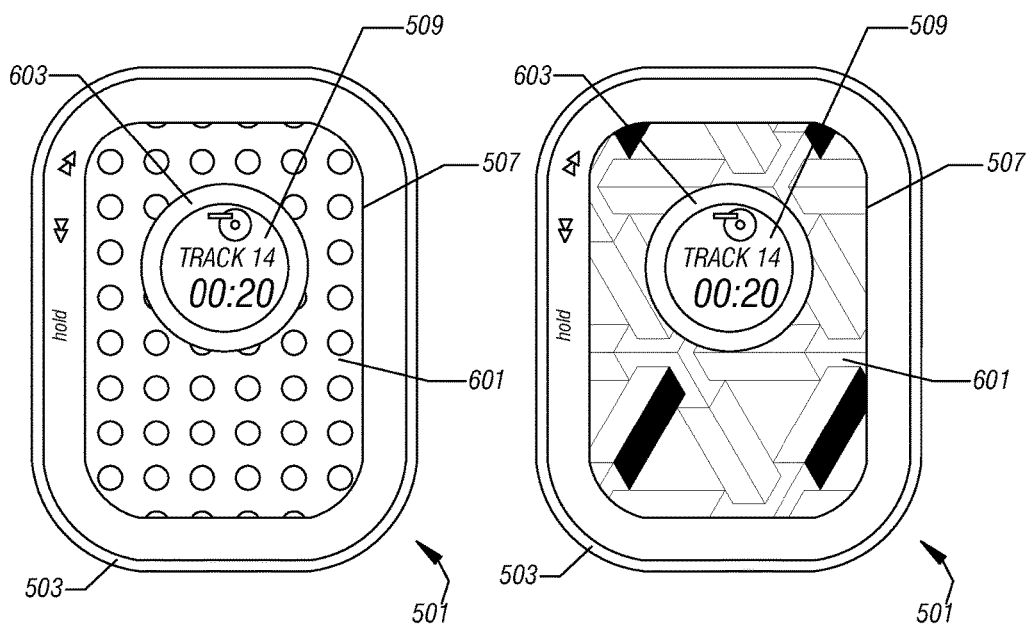
FIG. 7     FIG. 8
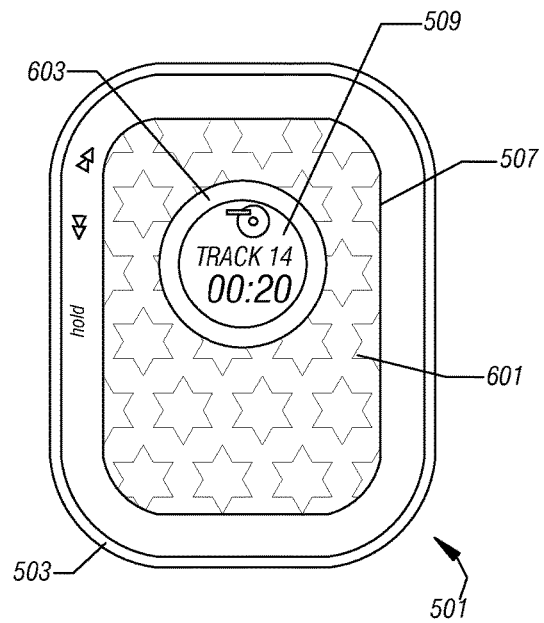
FIG. 9

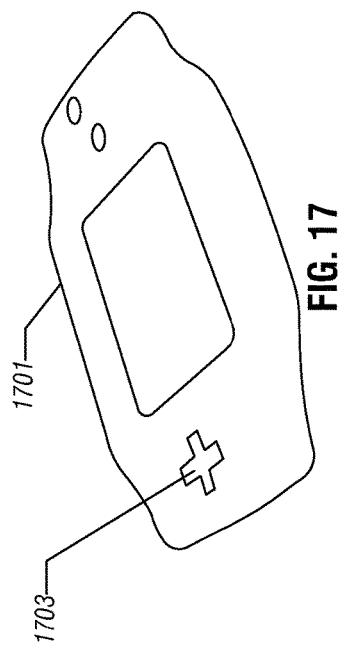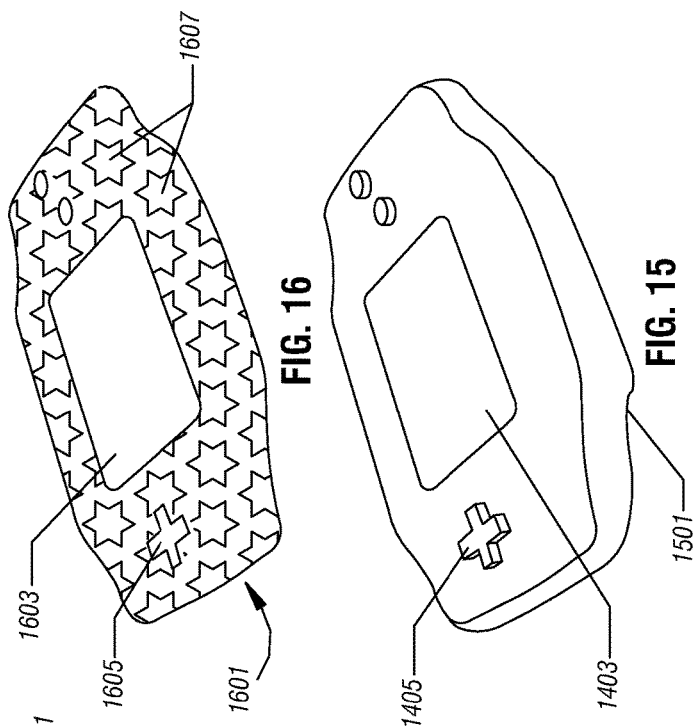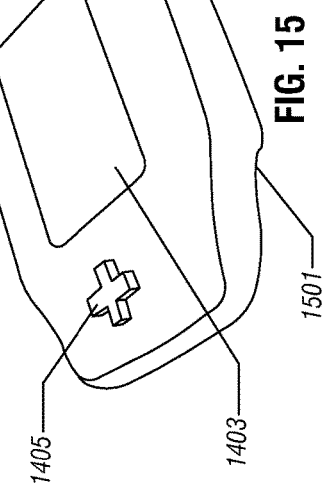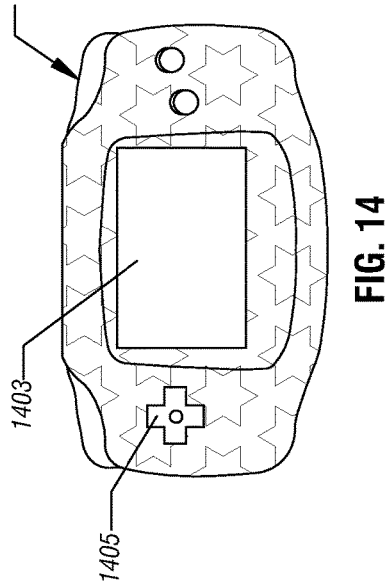
FIG. 17
FIG. 16
FIG. 15
FIG. 14

USER INTERCHANGEABLE ORNAMENTAL PORTIONS OF ELECTRONIC DEVICES

CROSS-REFERENCE TO RELATED APPLICATIONS

This application is a continuation of U.S. Patent application Ser. No. 14/145,772, filed Dec. 31, 2013 (the entire contents of which are hereby incorporated by reference as though fully set forth herein), which is a continuation of abandoned U.S. patent application Ser. No. 13/957,917, filed Aug. 2, 2013 (the entire contents of which are hereby incorporated by reference as though fully set forth herein), which is a continuation of U.S. patent application Ser. No. 12/827,934, filed Jun. 30, 2010 (now U.S. Pat. No. 8,532,720, issued Sep. 10, 2013) (the entire contents of which are hereby incorporated by reference as though fully set forth herein), which is a continuation of abandoned U.S. patent application Ser. No. 11/716,087, filed Mar. 9, 2007 (the entire contents of which are hereby incorporated by reference as though fully set forth herein), which is a continuation of U.S. patent application Ser. No. 10/044,613, filed Jan. 11, 2002 (now U.S. Pat. No. 7,206,618, issued Apr. 17, 2007) (the entire contents of which are hereby incorporated by reference as though fully set forth herein).

BACKGROUND

This invention relates to the field of portable electronic devices.

Today electronic devices are ubiquitous. Cell phones, portable disc players and the like can be seen daily in most public places such as on the beach and in shopping malls. Many families own multiple portable devices and not infrequently have a number of the same make and model units. For example, the husband and wife may each have the same cell phone model. The children may each have similar looking portable disc players.

In addition, many of the devices look similar even if they are from different manufactures. For example, many of the portable disc players are manufactured from dark colored plastic and are generally square shaped. Many portable phones have a similar shape. This similarity of devices can and often does lead to confusion. The husband will take the wrong phone or the children will argue over who owns a particular disc player. There is therefore a need to be able to distinguish one device from another similar device.

There is also a need to distinguish a particular portable device for promotional or other purposes. For example, cellular service providers may desire to put their logos on the phones they provide to customers. A museum may wish to uniquely identify the tape players they rent to patrons.

Therefore a need exists for a way to change the look of electronic equipment to aid in identifying a particular unit from other similar units and to allow a user to give their unit a unique look.

BRIEF DESCRIPTION OF THE DRAWINGS

FIG. 1 is a plan view of a cell phone incorporating a replaceable insert and a substantially transparent faceplate in accordance with one embodiment of the present invention;

FIG. 2 is an isometric view of a cell phone base with the faceplate removed in one embodiment of the present invention;

FIG. 3 is an isometric view of a replaceable insert having an ornamental design in accordance with one embodiment of the present invention;

FIG. 4 is an isometric view of a substantially transparent faceplate in accordance with one embodiment of the present invention;

FIGS. 7-9 are plan views of a digital audio player having three different ornamental designs printed on the replaceable insert in one embodiment of the present invention;

FIG. 14 is a plan view of a handheld digital game incorporating a replaceable faceplate and a substantially transparent faceplate in accordance with one embodiment of the present invention;

FIG. 15 is a plan view of a base section of the handheld digital game in accordance with one embodiment of the present invention;

FIG. 16 is a plan view of a replaceable insert in accordance with one embodiment of the present invention having an ornamental design thereon; and FIG. 17 is a plan view of a substantially transparent faceplate for the handheld digital game in accordance with one embodiment of the present invention.

DETAILED DESCRIPTION

Figure 5:
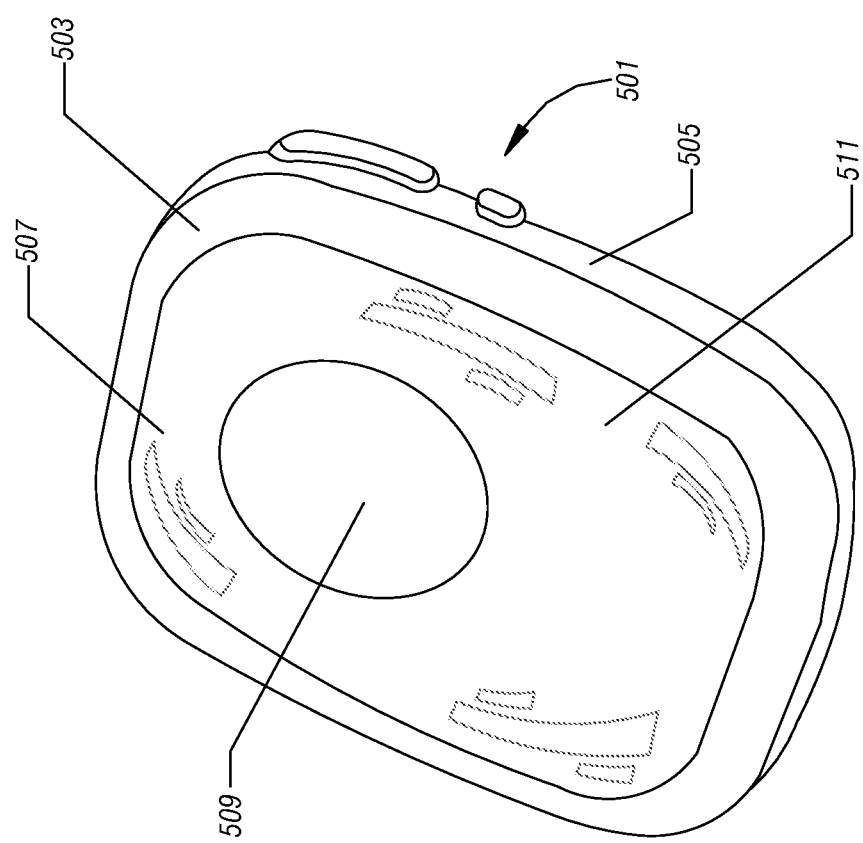
FIG. 5 is an isometric view of a digital audio player in accordance with one embodiment of the present invention.

Referring to FIG. 1, a portable cell phone 101 may display, in some embodiments, an ornamental design 103 that may be easily changed and customized by a user of the phone 101.

Referring to FIG. 2, a base section 201 of the cell phone 101 may, in some embodiments, include a plurality of operational controls of which 203, 205 and 207 may be representative. The base section 201 may also include a display 209 that may display the phone number being called and other operational data.

Referring to FIG. 3, in some embodiments, an insert 301 may incorporate a plurality of apertures of which 303, 305, 307 and 309 are representative. Apertures 303, 305 and 307 may be designed to allow the operational controls 203, 205, and 207 to be accessed from the front panel of the cell phone 101. Aperture 309 may allow the replaceable insert 301 to fit over the display 209 such that the display 209 is generally unobstructed.

Referring to FIG. 4, in some embodiments, a faceplate 401 may be designed to be affixed to the base section 201. In one embodiment of the present invention, the faceplate 401 may be manufactured of a material that is substantially transparent such as a clear plastic or other materials.

The cell phone 101 may be constructed such that the replaceable insert 301 may be sandwiched between the base section 201 and the inside of the faceplate 401. As the faceplate 401 is substantially transparent, any ornamental design on the replaceable insert 301 may be viewable through the faceplate 401. The replaceable insert 301 may be constructed of any material that is advantageous for the printing technology used to print an ornamental design thereon.

For example, in some embodiments, a paper material may be used if an ink-jet or photocopy process is utilized to print a design on the insert 301. The paper may be fed into a printer or copier as a normal sheet of paper would. After the image has been transferred to the insert 301, the insert 301 may be formed to the size required and placed between the faceplate 401 and the base section 201. To assist in the printing process, the insert may be integrated into a full sheet of 8.5" by 11" paper with punch out tabs to assist in separating the insert 301 from the remainder of the paper.

Many of the well known graphics programs which run on home or office computers may be used to design and print a desired image on the insert 301. Alternatively, specialized programs may be designed and made available to those wishing to make custom inserts. The printing may be conveniently performed by using a home or office printer that utilizes an ink-jet, laser or other technology.

For mass produced designs, in addition to paper based materials, Mylar or other materials may be utilized to fabricate the insert should a printing technology such as silk screening or other large scale printing processes be utilized.

Another embodiment of the invention is illustrated in FIG. 5. In FIG. 5, a digital audio player 501 includes a faceplate 503 and a base 505. The faceplate 503 may be manufactured such that a viewing section 507 of the faceplate 503 is substantially transparent. A display 509 may be visible through the faceplate 503 as is a top surface 511 located under the faceplate 503. The faceplate 503 may cover substantially the entire top surface 511 of the base 505.

A "digital audio player" as used herein is an electronic device in which audio is stored digitally in non-volatile memory and converted to an analog signal for playback. Examples of non-volatile memory are solid state memory or digital audio tape.

Figure 6:
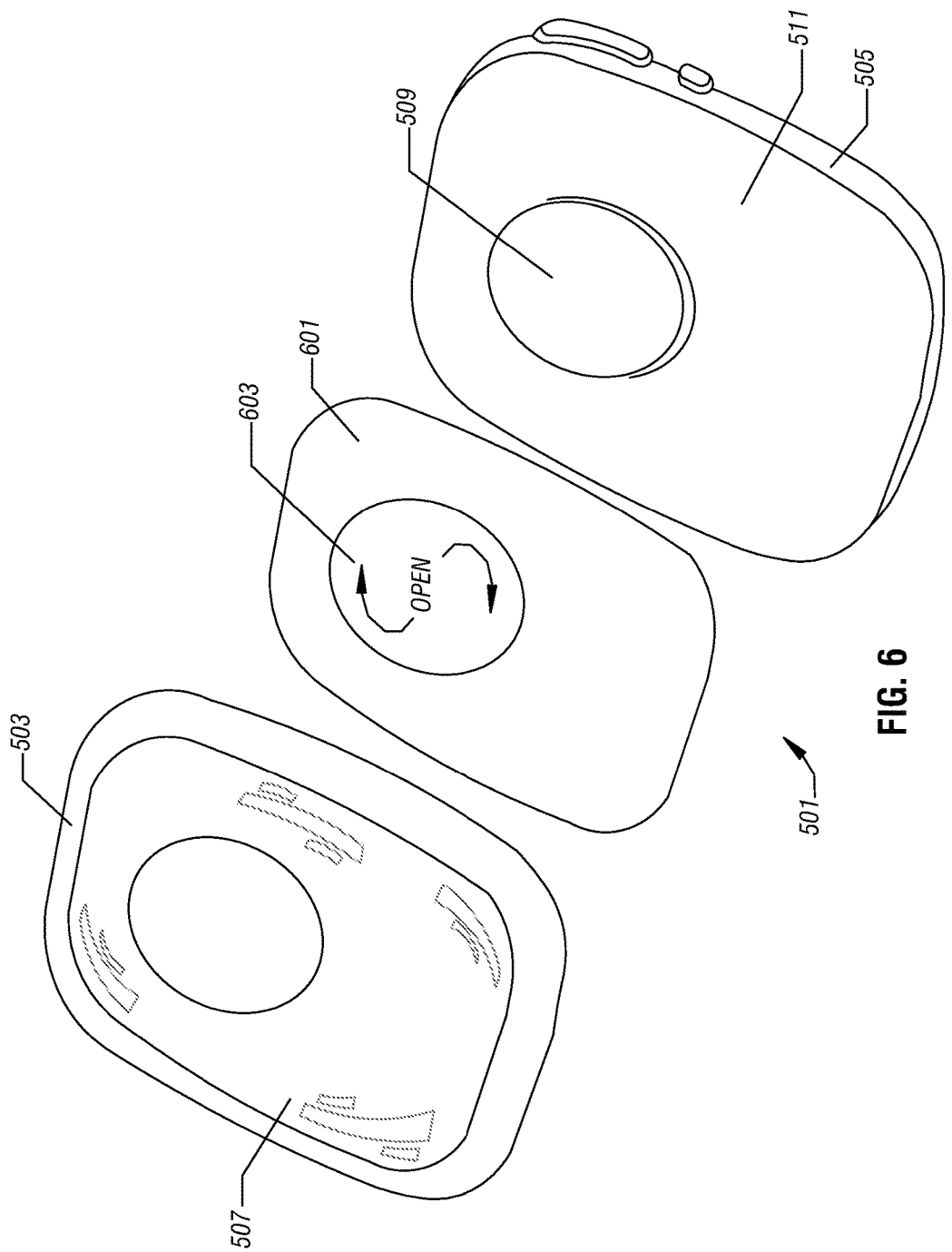
FIG. 6 is an exploded view of the digital audio player illustrated in FIG. 1.

In one embodiment of the present invention illustrated in FIG. 6, an insert 601 may fit between the top surface 511 and the underside of the faceplate 503. Insert 601 may include a display aperture 603 that may permit the display 509 to be viewed once the insert 601 is positioned on the top surface 511. In one embodiment, the player 501 may be constructed such that when the faceplate 503 is affixed to the base 505, the insert 601 may be visible through the viewing section 507.

The insert 601 may be manufactured of any convenient material but may be advantageously manufactured of a material such as paper which may retain an image when printed on by an ink jet, laser or other printer, or copied onto by a photocopier or other image transfer device. In this way, an image on the insert 601 may be visible to a user through the viewing section 507.

In some embodiments, insert 601 may be provided by the manufacturer of the digital audio player 501 with an image already printed on it or the user may be provided with blank inserts. The user may use a graphics software program to create a fanciful design, which may then be printed or copied onto a blank insert. To replace the insert 601, the faceplate 503 may be removed from the base 505 and a new insert substituted for the old insert 601. The faceplate 503 may then be affixed again to the base 505. In this manner a user may customize the appearance of the digital audio player 501 and change that appearance at any time.

Referring to FIG. 7, in some embodiments, the insert 601 may have a pattern that may appear as rows of circles. In other embodiments the insert 601 may have a pattern that may resemble a network of interconnected beams (FIG. 8) and in still other embodiments, the insert 601 the image of a series of stars may be printed on the insert 601 (FIG. 9).

Figure 10:
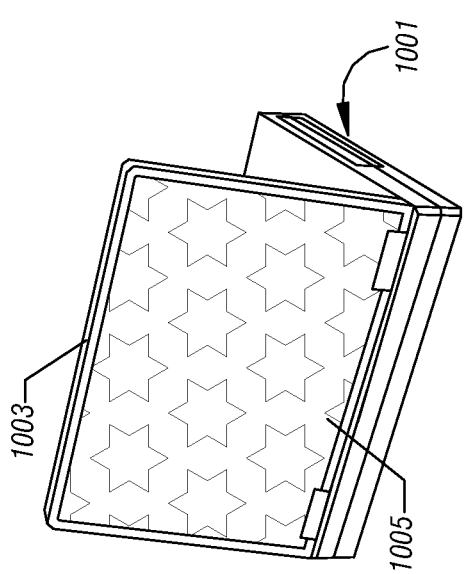
FIG. 10 is an isometric view of a laptop computer incorporating a replaceable insert and a substantially transparent faceplate in accordance with one embodiment of the present invention.

Referring to FIG. 10, in some embodiments, a laptop computer 1001 may include a display housing 1003 on top of which an ornamental design 1005 may be visible.

Figure 11:
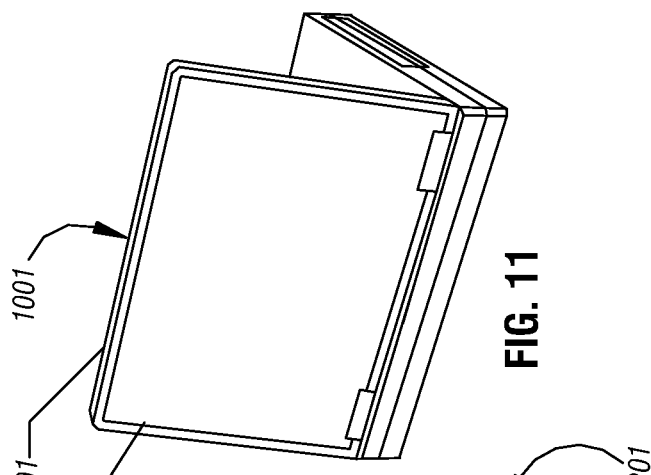
FIG. 11 is an isometric view of a base section of the top lid of the laptop computer in one embodiment of the present invention.
Figure 12:
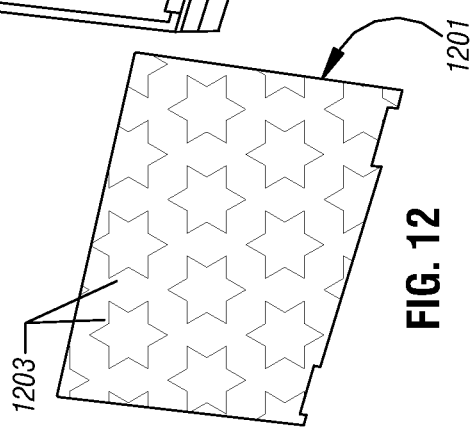
FIG. 12 is an isometric view of a replaceable insert in accordance with one embodiment of the present invention having an ornamental design thereon.
Figure 13:
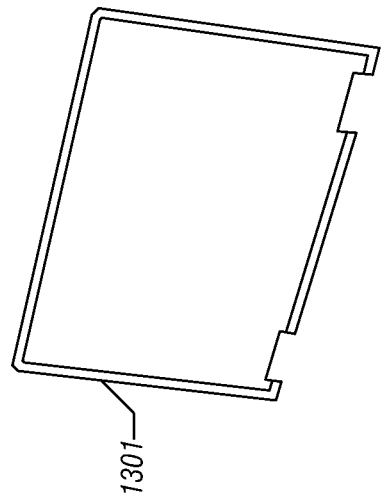
FIG. 13 is an isometric view of a substantially transparent faceplate for the laptop computer in accordance with one embodiment of the present invention.

FIGS. 11-13 illustrate an exploded view of the laptop computer of FIG. 10. Referring to FIG. 11, a base section 1101 of the display housing 1003 may incorporate an insert retention feature 1103 according to some embodiments.

A replaceable insert 1201 (FIG. 12) in accordance with one embodiment of the present invention may be constructed such that it fits within the insert retention feature 1103 on the base section 1101. An ornamental design 1203 may be printed on the replaceable insert 1201.

Referring to FIG. 13, a faceplate 1301, in one embodiment, may be designed to fit on top of the base section 1101 and be retained thereon. To permit viewing the replaceable insert 1201, the faceplate 1301 may be advantageously constructed of a substantially transparent material in some embodiments.

As in the other embodiments, the replaceable insert 1201 may be sandwiched between the base section 1101 and the inside of the faceplate 1301. As the faceplate may be generally transparent, any ornamental design such as 1203 on the replaceable insert 1201 may be visible through the faceplate 1301. By changing the replaceable insert 1201 with another insert having a different ornamental design, the appearance of the laptop computer 1001 may be customized.

Referring to FIG. 14, in accordance with another embodiment, a handheld digital game 1401 may include a display 1403 and game controls of which 1405 may be representative.

As best illustrated in FIGS. 15-17, the handheld digital game 1401 may include a base section 1501 upon which the display 1403 and game control 1405 are located in one embodiment. Additionally, in some embodiments, a replaceable insert 1601 may be provided that may have cutout areas 1603 and 1605 designed to fit over the display 1403 and game control 1405 respectively. The insert 1601 may also have an ornamental design 1607 thereon.

Referring to FIG. 17 a faceplate 1701 for the digital game 1401 may include an opening 1703 to allow access to the game control 1405 and may be constructed of a substantially transparent material.

In some embodiments, the digital game 1401 may be designed such that the replaceable insert 1601 may be sandwiched between the base section 1501 and the inside of the faceplate 1701. The faceplate 1701 may be designed to be affixed to the base section 1501. In this manner, the ornamental design 1601 on the replaceable insert 1601 may be visible through the faceplate 1701. As with the prior described embodiments, by changing the replaceable insert 1601, the appearance of the digital game 1401 may be customized.

In all of the above described embodiments, the faceplate and ornamental insert combination cover a substantial portion of a surface of an electronic device to provide the electronic device with a unique appearance that may be easily changed. By changing the ornamental insert, a large number of unique appearances may be achieved.

While the present invention has been described with respect to a limited number of embodiments, those skilled in the art will appreciate numerous modifications and variations therefrom. It is intended that the appended claims cover all such modifications and variations as fall within the true spirit and scope of this present invention.

The invention claimed is:

1. An apparatus, comprising:
 a cover removably coupled to a portable electronic device, the cover having a non-transparent outer edge and a transparent central area; and
 an insert adapted to cover at least a portion of a first side of the portable electronic device.

2. The apparatus of claim 1, wherein the non-transparent outer edge is removably coupled to an outer edge of the portable electronic device and the transparent central area to cover the first side of the portable electronic device.

3. The apparatus of claim 2, wherein a second side of the portable electronic device is not covered when the cover is removably coupled to the portable electronic device.

4. The apparatus of claim 2, wherein the insert is adapted to fit between the cover and the electronic device when the cover is removably coupled to the electronic device.

5. The apparatus of claim 4, wherein the insert includes one or more ornamental features.

6. The apparatus of claim 4, wherein the insert is visible through the transparent central area when the insert is located between the cover and the portable electronic device while the cover is removably coupled to the portable electronic device.

7. The apparatus of claim 2, wherein the cover is substantially rectangular with rounded edges.

8. The apparatus of claim 2, wherein the insert is substantially rectangular with rounded edges.

9. The apparatus of claim 1, wherein the portable electronic device comprises a cellular phone.

* * * * *